United States Patent [19]

Brown

[11] Patent Number: 4,520,561
[45] Date of Patent: Jun. 4, 1985

[54] METHOD OF FABRICATING AN ELECTRONIC CIRCUIT INCLUDING AN APERTURE THROUGH THE SUBSTRATE THEREOF

[75] Inventor: Richard Brown, Union County, N.J.
[73] Assignee: RCA Corporation, Princeton, N.J.
[21] Appl. No.: 562,244
[22] Filed: Dec. 16, 1983
[51] Int. Cl.³ .............................................. H05K 3/34
[52] U.S. Cl. ....................................... 29/840; 29/830; 174/68.5
[58] Field of Search .......................... 29/840, 825, 830; 174/68.5; 361/398, 412, 414; 427/97

[56] References Cited

U.S. PATENT DOCUMENTS

| | | |
|---|---|---|
| 2,926,340 | 2/1960 | Blain et al. |
| 3,077,658 | 2/1963 | Wharton |
| 3,185,947 | 5/1965 | Freymodsson |
| 3,281,627 | 10/1966 | Fetterrolf et al. |
| 3,326,645 | 6/1967 | Counts et al. |
| 3,352,730 | 11/1967 | Murch, Jr. |
| 3,357,856 | 12/1967 | Ragan et al. |
| 3,964,087 | 6/1976 | Mallon |
| 4,208,080 | 6/1980 | Teagno |
| 4,372,046 | 2/1983 | Suzuki |

FOREIGN PATENT DOCUMENTS 33677 8/1981 European Pat. Off.

OTHER PUBLICATIONS

IBM Tech. Discl. Bulletin vol. No. 15, Dec. 1972, pp. 2183-2184, by Warwick.

Primary Examiner—Howard N. Goldberg
Assistant Examiner—Carl J. Arbes
Attorney, Agent, or Firm—Joseph S. Tripoli; Robert L. Troike; Raymond E. Smiley

[57] ABSTRACT

An electronic circuit including a substrate with an aperture therethrough is manufactured by cutting one or more slots in an edge of a slab of substrate, metalizing the slotted edge of the substrate and metalizing a mating edge of a mating substrate, securing together the metalized edges of the slotted substrate and mating substrate to create an aperture through the substrate from an upper surface to a lower surface thereof and creating a printed circuit pattern on one of the upper and lower surfaces of the combined substrate and metalizing the other surface of the combined substrate including a connection to the metalized edges.

4 Claims, 8 Drawing Figures

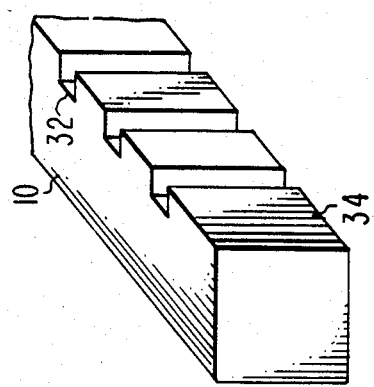
Fig. 1
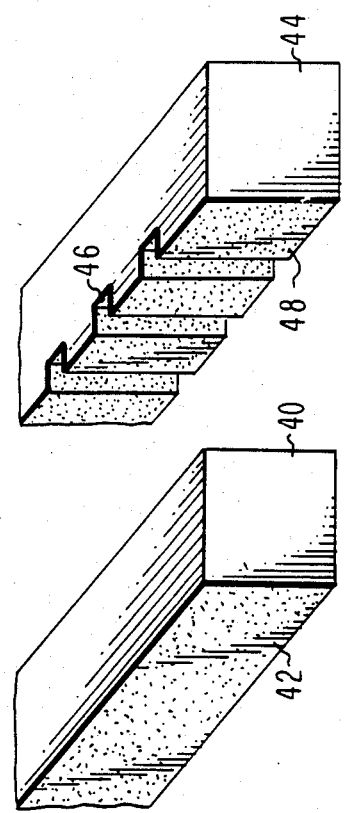
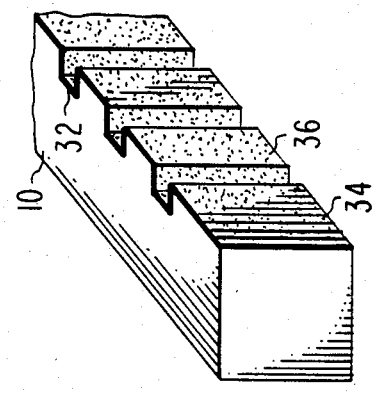
Fig. 2a  Fig. 2b  Fig. 2c

METHOD OF FABRICATING AN ELECTRONIC CIRCUIT INCLUDING AN APERTURE THROUGH THE SUBSTRATE THEREOF

This invention is concerned with the fabrication of an electronic circuit and more particularly with the fabrication of such a circuit having at least one aperture through the circuit substrate.

BACKGROUND OF INVENTION

In the fabrication of an electronic circuit incorporating an insulating substrate where there is a need for an aperture through the substrate, there arises a problem of how to create the aperture. If a round aperture is desired or acceptable, and if the substrate is of relatively soft material, the aperture may be simply drilled through the substrate or the aperture may be punched through the substrate. Where, however, the aperture must be of another shape, rectangular, for example, or where the substrate is brittle and/or abrasive, other measures must be utilized.

SUMMARY OF THE INVENTION

In accorance with a preferred embodiment of the present invention, a method for fabricating an electronic circuit on first and second slabs of electrically insulating substrates including at least one aperture through the substrates, comprises the steps of: cutting at least one slot along an edge of one substrate between an upper surface thereof and a lower surface thereof, metalizing the edge in which the slot is cut, metalizing an edge of the second substrate, securing the metalized edges of the first and second substrates together, thus forming an aperture extending between the upper surface and the lower surface of the combined substrates, forming a printed circuit pattern on one of the upper and lower surfaces of the combined substrates and metalizing the other surface including a connection with the metalized edges.

BRIEF DESCRIPTION OF THE DRAWING

FIG. 1 is a slab of insulating substrate material illustrated in perspective with a plurality of slots cut into one edge thereof;

FIG. 2a is the slotted slab in perspective as illustrated in FIG. 1 with metalization applied to the slab edge;

FIGS. 2b and 2c are two alternative metalized mating slabs ready to be secured to the slab of FIG. 2a;

DETAILED DESCRIPTION

FIG. 1 illustrates a slab 10 of substrate material of, for example, beryllium oxide or alumina which are polycrystalline ceramic type materials suitable for use in microwave circuits which include active power devices. Single crystal type materials, such as sapphire, are also suitable. Beryllium oxide is a particularly good substrate material because it acts as an excellent electrical insulator and as an excellent heat conductor. As with most materials, beryllium oxide has some disadvantages. For example, beryllium oxide is rather porous making it difficult to print on its surface an accurate circuit pattern. This problem may be solved by following the teachings of U.S. Pat. No. 4,376,287 issued Mar. 8, 1983 to Franco Sechi and assigned to the common assignee. Beryllium oxide is, furthermore, an abrasive and brittle material making it difficult to create apertures therein. This problem has led to the instant invention.

Figure 6:
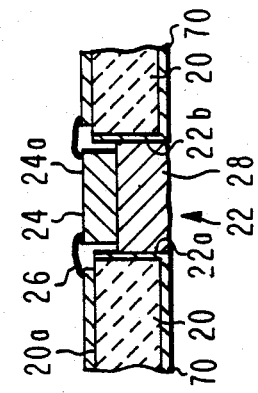
FIG. 6 is an elevation section view along lines 6—6 of FIG. 5 illustrating in detail an active device pellet mounted in position in the aperture of the finished substrate.

The reason for creating an aperture in the substrate is best illustrated in FIG. 6 which is an elevation cross section view of a finished microwave circuit. It should be understood that FIG. 6 is drawn to a larger scale than that to which FIGS. 1-5 are drawn. Legend 20 indicates substrate material surrounding metalized aperture walls 22a and 22b of an aperture 22. An active power device such as FET pellet 24 is positioned in the aperture 22. Conductive wires such as 26 extend from upper surface 24a of the pellet (gate or drain electrodes, for example) to a printed circuit pattern (see FIG. 5) on the upper surface 20a of substrate 20. The lower surface 24b of pellet 24 (source, for example) is in electrical contact with a conductive aperture filling substance 28 such as solder, epoxy, metal insert or a combination thereof.

With the pellet positioned in the aperture as illustrated wire bonds such as 26 may be made very short resulting in minimal inductance at the frequencies of interest in microwave circuits. If surface 24a of the pellet 24 were to be mounted on surface 20a of substrate 20, wire bonds 26 would, of necessity, be much longer resulting in excessive inductance.

Returning to FIG. 1, a substrate slab 10 (shown partially broken away) has one or more slots 32 (three being illustrated) formed in an edge 34 thereof as a first step in manufacturing a microwave circuit. A rectangular slot 32 facilitates mounting of a rectangular pellet as described in connection with FIG. 6 but any suitable shape is acceptable. The slots 32 are machined into substrate slab 10 utilizing conventional milling machinery for example.

Referring next to FIG. 2a, edge 34 of substrate slab 10 is metalized using any suitable method of metalization. The slots 32 also may be metalized depending on the application. Speckling 36 in FIG. 2 illustrates those areas of substrate slab 10 which are metalized. The metalized layer typically comprises a relatively thin chromium layer adhered to the slab 10 with a relatively thick (25–50 μm) layer of copper adhered to the chromium layer. In FIG. 2b a mating slab of substrate material 40 similar in size and material to substrate slab 10 having an edge 42 for mating with edge 34 of substrate slab 10 is also metalized using the same techniques and same materials as use for metalization layer 36.

In some instances it is desirable not to cut relatively deep slots 32 into substrate slab 10. In those instances a suitable alternative to slab 40 is a slab 44, FIG. 2c, which has one or more slots 46 prepared in the same manner and at the same spacing as slots 32 on substrate slab 10. Substrate slab 44 like substrate slab 42 is also metalized as illustrated by speckling 48.

Figure 3:
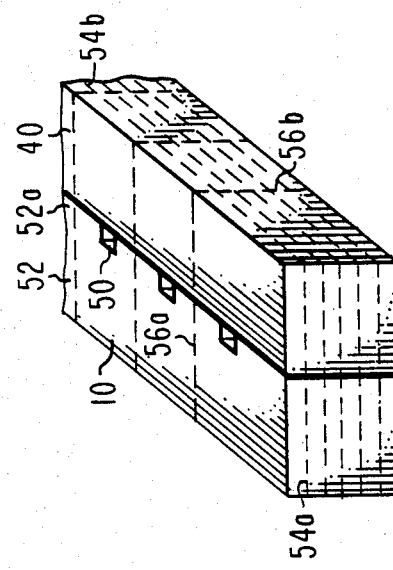

Referring next to FIG. 3 substrate slabs 10 and 40 are secured together such that edge 34 (FIG. 2a) of substrate slab 10 and edge 42 (FIG. 2b) of substrate slab 40 are mated. The method of securing the two metalized surfaces to one another may include any conventional technique such as the thermocompression bonding in an inert atmosphere. The result of securing the two substrates together is to create apertures such as 50 (three being illustrated in FIG. 3) extending from the upper surface 52a to the lower surface 52b of a combined substrate slab 52. The metalization layer 58 which extends from surface 52a to surface 52b is termed a septum and provides an electrically conductive path between the two surfaces.

Figure 4:
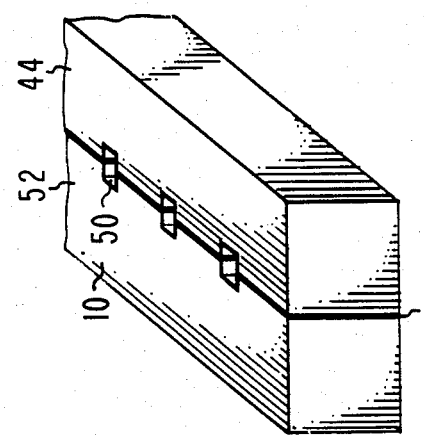
FIGS. 3 and 4 are finished slabs illustrated in perspective ready to be sectioned.

FIG. 4 illustrates the alternative situation in which edge 34 (FIG. 2a) of substrate slab 10 is secured to edge 48 (FIG. 2c) of substrate slab 44. Combined substrate 52 having apertures 50 and having a septum 58 is substantially identical to what is illustrated in FIG. 3.

The next step is to slice the substrate slab into finished size substrate pieces. Of course, it is possible to make finished substrate size pieces from the beginning but as a practical matter, it is better to utilized slab of substrate material suitable for slicing along lines 54a, 54b, FIG. 3 and lines parallel thereto and then dicing along dashed lines 56a, 56b, FIG. 3 and lines parallel thereto to create finished substrates. The terms "slicing" and "dicing" are used to distinguish the types of cuts that are made and otherwise have no special meaning.

Figure 5:
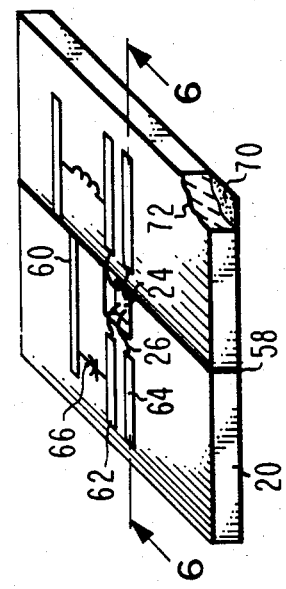
FIG. 5 is the final substrate illustrated in perspective with printed circuit patterns thereon.

A finished substrate is illustrated in FIG. 5 to a larger scale than the scale employed in illustrating FIGS. 1-4 but to a smaller scale than the scale of FIG. 6. The finished substrate of FIG. 5 results from slicing along dashed lines 54a, 54b and dicing along the dashed lines 56a, 56b of FIG. 3. The number of slices made parallel to lines 54a, 54b depends on the thickness of the slab typically 2.5 cm and the thickness of the finished substrate. A typical number of slices is 10 to 20, each 0.4 to 0.6 mm thick.

The number of dices parallel to lines 56a, 56b depends on the number of slots formed into the original slab and the number of apertures desired in the finished substrate. A finished substrate having one or two apertures is typical. A typical number of finished substrates is 40 to 150.

After the slices are created but before the dices are made to make the finished substrates, the desired printed circuit conductive patterns are formed on the upper surface of what will be each finished substrate. The printed circuit pattern for each finished substrate is typically though not necessarily the same as that illustrated in FIG. 5. A conductive ground plane 70 is created on the lower surface of the substrate each being done in any suitable conventional fashion. Substrate 20 is shown broken away at 72 so that ground plane 70 is visible. In particular, some lines of the printed circuit pattern typically will contact the septum 58. One exemplary line is 60. Other printed circuit lines are purposely kept away from the system. Examples of such lines are 62 and 64.

Circuit elements connecting between the various printed circuit lines may either be printed onto the substrate or be discrete components. Thus, capacitor 66 extends between lines 62 and 60 by way of example. An active device such as an FET pellet 24 is positioned in the aperture in the finished substrate. Alternatively, other circuitry, such as couplers or other substrate materials, may be positioned in aperture 22, FIG. 6.

As earlier mentioned, conductive wires are connected between various electrodes on pellet 24 and the printed circuit pattern on the finished substrate. Thus, for example, conductive wire 26 connects between pellet 24 and conductor 64 while conductive wire 27 connects between pellet 24 and conductor 62.

It will be understood that FIG. 6, referred to earlier, is an elevational cross-section view taken along lines 6—6 of FIG. 5 and illustrates to an enlarged scale a portion of the finished circuit of FIG. 5.

It will be understood that the apertures created by the method above described may be utilized for purposes other than housing an FET pellet in keeping with the intent of the invention but the so-created apertures are particularly useful for inserting pellets as described in connection with FIGS. 5 and 6.

What is claimed is:

1. A method for fabricating an electronic circuit on first and second slabs of electrically insulating substrates including at least one aperture through the substrates, comprises the steps of:
   a. cutting at least one slot along an edge of said one substrate between an upper surface thereof and a lower surface thereof;
   b. metalizing said edge in which said slot is formed;
   c. metalizing an edge of said second substrate;
   d. securing the metalized edges of the first and second substrates together, thus forming an aperture extending between the upper surface and the lower surface of the combined substrates;
   e. forming a printed circuit pattern on one of said upper and lower surfaces of said combined substrates; and
   f. metalizing the other surface including a connection with the metalized edges created in steps (b) and (c) above.

2. The method as set forth in claim 1 further including between steps (d) and (e) thereof the further step of slicing through the combined substrate normal to the apertures therein one or more times to create two or more substrates and wherein steps (e) and (f) of claim 1 are performed on each of the created substrates.

3. The method as set forth in claim 1, wherein the electronic circuit further includes an amplifying device pellet, the further included step of installing said active device pellet into said aperture and connecting conducting leads from the pellet to elements of said printed circuit pattern.

4. The method as set forth in claim 2, wherein the electronic circuit further includes an amplifying device pellet, the further included step of installing said active device pellet into said aperture and connecting conducting leads from the pellet to elements of said printed circuit pattern.

* * * * *